(12) United States Patent
Bansemir et al.

(10) Patent No.: US 7,247,974 B2
(45) Date of Patent: Jul. 24, 2007

(54) ROD-SHAPED HIGH-STRESS ACTIVE CONNECTION ELEMENT AS WELL AS ROTORCRAFT HAVING SUCH A CONNECTION ELEMENT

(75) Inventors: Horst Bansemir, Munich (DE); Stefan Emmerling, Neubiberg (DE)

(73) Assignee: Eurocopter Deutschland GmbH, Donauwoerth (DE)

( * ) Notice: Subject to any disclaimer, the term of this patent is extended or adjusted under 35 U.S.C. 154(b) by 184 days.

(21) Appl. No.: 11/009,479

(22) Filed: Dec. 13, 2004

(65) Prior Publication Data

US 2005/0146246 A1 Jul. 7, 2005

(30) Foreign Application Priority Data

Dec. 12, 2003 (DE) ................. 103 58 200

(51) Int. Cl.
*H01L 41/08* (2006.01)
(52) U.S. Cl. ..................................... 310/328
(58) Field of Classification Search ........... 310/321, 310/328, 330–333
See application file for complete search history.

(56) References Cited

U.S. PATENT DOCUMENTS

| | | | | |
|---|---|---|---|---|
| 4,460,842 A | * | 7/1984 | Waanders et al. | 310/338 |
| 4,742,261 A | * | 5/1988 | Rich et al. | 310/328 |
| 4,958,100 A | * | 9/1990 | Crawley et al. | 310/328 |
| 5,705,241 A | | 1/1998 | Schutze | |
| 6,206,460 B1 | | 3/2001 | Seeliger et al. | |
| 6,685,113 B1 | * | 2/2004 | Ruehle et al. | 239/585.1 |
| 6,998,761 B1 | * | 2/2006 | Frank et al. | 310/328 |

FOREIGN PATENT DOCUMENTS

| | | |
|---|---|---|
| DE | 39 22 504 A 1 | 7/1989 |
| DE | 3939822 | 6/1991 |
| DE | 42 28 974 A 1 | 8/1992 |
| DE | 19524080 | 8/1996 |
| DE | 196 53 555 A 1 | 12/1996 |
| DE | 198 13 959 A 1 | 3/1998 |
| DE | 199 06 468 A 1 | 2/1999 |
| DE | 101 39 686 A1 | 8/2001 |
| DE | 101 54 391 A 1 | 11/2001 |
| EP | 0955228 | 11/1999 |
| WO | WO 98/45886 | 10/1998 |

OTHER PUBLICATIONS

German Office Action dated Jan. 27, 2006.

* cited by examiner

*Primary Examiner*—Mark Budd
(74) *Attorney, Agent, or Firm*—Crowell & Moring LLP

(57) ABSTRACT

Active connection element for connecting at least two structural components with a first end with a first connection area assigned to the first structural component and a second end with a second connection area assigned to the second structural component, a load-diminishing intermediate section through which intermediate section the flux of force between the first and second connection areas extends when the connection element is loaded, in which at least one controllable extension actuator having at least a piezo stack is arranged parallel to the intermediate section. When operated, the piezo stack extends the connection element at least in the area of the intermediate section in a controlled manner in order to actively suppress or insulate vibrations between the structural components. A prestressing device having a prestressing element exercises a compressive prestressing onto the piezo stack.

16 Claims, 2 Drawing Sheets

ROD-SHAPED HIGH-STRESS ACTIVE CONNECTION ELEMENT AS WELL AS ROTORCRAFT HAVING SUCH A CONNECTION ELEMENT

This application claims the priority of 103 58 200.2, filed Dec. 12, 2003, the disclosure of which is expressly incorporated by reference herein.

BACKGROUND AND SUMMARY OF THE INVENTION

The present invention relates to a rod-shaped high-stress active connection element for connecting at least two structural components as well as to a rotorcraft, particularly a helicopter, having at least one such connection element.

From German Patent Documents DE 198 13 959 A1, DE 101 39 686 A1 as well as DE 101 54 391 A1 respectively, a rod-shaped high-stress active connection element is known for connecting at least two structural components. Such active connection elements, which are also called active struts, are used particularly in the case of rotorcraft or helicopters in order to mutually connect at least a first structural component (such as a transmission) and at least a second structural component (such as an airframe) in a secure manner and actively suppress or minimize vibrations, particularly structure-borne noise, and to insulate the second structural component as much as possible with respect to the latter. A corresponding connection element has to transmit loads of several tons and is a safety-relevant component. Such connection elements are becoming increasingly important in rotorcraft technology, because the impairment of the passenger comfort as well as structural stress caused by sound and vibrations are still very high, and an improvement can be achieved by means of these components.

Such a connection element comprises a first end with a first connection area, which is assigned to the first structural component, and a second end with a second connection area, which is assigned to the second structural component; a load-diminishing intermediate section arranged between the first and second connection area, through which intermediate section the flux of force between the first and second connection area extends when the connection element is loaded; at least one controllable extension actuator having a piezo stack or a flat piezo arrangement, which extension actuator is arranged parallel to the intermediate section and, when operated, extends the connection element at least in the area of the intermediate section in a controlled manner in order to actively suppress or insulate vibrations between the first and second structural component; a prestressing device having a prestressing element exercising a mechanical pressure-type prestressing onto the piezo stack.

In the case of the connection elements of the above-mentioned type, the connection areas are constructed in the form of a continuous strut or a continuous rod in one piece with the intermediate piece. Extension actuators with a flat piezo arrangement are normally glued directly onto the outer circumference of the strut. Extension actuators with a piezo stack, in turn, are mounted by special separate external holding devices, which are fastened to the strut, on the exterior side of the strut. When such a separate holding device is used, the prestressing device arranged parallel to the intermediate section is fixed on this holding device. In particular, in the case of extension actuators with a flat piezo arrangement, a prestressing is achieved in that the carrier structure to which the extension actuator is applied, is first subjected to a tensile stress and is then relaxed again after the mounting of the piezo stack.

Arrangements are also known in which the extension actuator is arranged in series with the intermediate section. However, such configurations have been less successful in practice and are therefore of secondary importance.

The above-mentioned known constructions have various disadvantages. Thus, it was found that, in particular, glued-on extension actuators with flat piezo arrangements chip off easily in the operation of the strut and therefore fail. Such extension actuators also only have a fairly low efficiency and can transmit only comparatively low forces to the strut. Piezo stacks, which per se have a higher efficiency than completely flat piezo arrangements, cannot be used in this type of actuator.

Although in the case of connection elements or struts equipped with separate holding devices and prestressing devices, the use of extension actuators having a piezo stack can be implemented, these conventional constructions require very high expenditures with respect to their construction and manufacturing and are also relatively heavy, which does not meet the light-weight construction requirements existing in aircraft construction. Furthermore, the mounting of separate holding devices and prestressing devices on the exterior side of the strut as well as the establishment of a secure connection between these components presents problems because, on the one hand, a good connection of the holding device with respect to the strut has to exist in order to introduce the forces of the actuator into the strut but, on the other hand, the strut should not be weakened by stress concentration, unfavorable stiffness skips, and the like.

Also in the case of such connection elements or struts, it was found that the efficiency of the extension actuator is not optimal. For an improvement of the efficiency, the stiffnesses of the participating structural components have to be mutually matched and adapted in a specific manner. However, in the case of these types of constructions, this would again result in an excessively reduced diameter and thus to a weakening of the strut. As a result, no more favorable solution could be implemented in this type of construction.

In the case of the above-described known connection elements, it is difficult to electrically insulate the extension actuators, which are operated electrically because of the used piezo technology, from the connection element or the strut, particularly because, as a rule, so far the struts have been constructed of a metallic material.

From German Patent Documents DE 196 53 555 A1, DE 199 06 468 A1 and DE 39 22 504 A1, controllable extension actuators are known which comprise a housing body and a piezo stack arranged inside the housing, which piezo stack is functionally coupled with a control element of the extension actuator. Furthermore, a prestressing element is arranged inside the housing, which prestressing element exercises a mechanical pressure-type prestressing on the piezo stack. This prestressing element is, for example, a compression spring or bellows which encloses the piezo stack. By way of intermediate elements, such as intermediate disks, the prestressing element is supported on the housing and the piezo stack. German Patent Document DE 39 22 504 A1 also discloses a variant, in the case of which the prestressing element in the form of bellows is arranged inside a passage opening provided in the piezo stack.

German Patent Document DE 42 28 974 A1 shows a comparable extension actuator, in the case of which the prestressing element in the form of a cup spring is arranged outside the actual housing between an external housing section and a tappet projecting out of the housing. Such extension actuators are normally used for the operation of an injection nozzle or a comparable function element. In contrast to the above-mentioned load-diminishing active connection elements, the extension actuators or their housings have no special load-diminishing functions and are also not used for manipulating their own housing for the purpose of a vibration insulation or reduction. Extension actuators of the type mentioned in this and the preceding section are therefore also not the object of the present invention.

The invention is based on the object or on the technical problem of creating a rod-shaped high-stress active connection element of the above-mentioned type which avoids as much as possible the disadvantages of the prior art and, without impairing its functionality and safety with respect to its vibration insulating and minimizing characteristics, has an improved efficiency. In addition, a rotorcraft, particularly a helicopter, is to be provided which has at least one such connection element.

According to a first aspect, this object is achieved by means of a rod-shaped high-stress active connection element for connecting at least two structural components, the connection element comprising;

a first end with a first connection area which is assigned to the first structural component, and a second end with a second connection area which is assigned to the second structural component;

a load-diminishing, mechanically highly stressable intermediate section which is arranged between the first and the second connection area and through which the flux of force between the first and second connection area extends when the connection element is stressed;

at least one controllable extension actuator which has at least one piezo stack and is arranged parallel to the intermediate section and, when operated, extends the connection element in a controlled manner at least in the area of the intermediate section in order to actively suppress or insulate vibrations between the first and second structural component; and a prestressing device with a prestressing element, which exercises a mechanical pressure-type prestressing onto the piezo stack. The connection element according to the invention which may be further developed, for example, in the form of an oblong or more compact strut or the like, is characterized in that the prestressing element is the load-diminishing intermediate section itself.

The connection element according to the invention or its extension actuator can be controlled by a controlling and/or regulating device known per se, which comprises at least one vibration sensor which may be arranged, for example, in the vicinity of at least one of the connection areas or on at least one of the structural components to be connected.

In the case of the connection element according to the invention, the intermediate section does not only take over a purely load-diminishing function but simultaneously also the function of a highly effective prestressing element by means of which high prestressing forces can be transmitted to the piezo stack. In this case, the prestressing takes place in the longitudinal direction of the connection element or essentially in the longitudinal direction of the connection element and is selected such that the piezo stack is never relieved or even subject to tensile loading during the operation of the connection element and possibly destroyed thereby. The used piezo elements can be stacked in the longitudinal direction of the connection element and over essentially the entire length of the intermediate section. This results in a large stacking height and thereby already in a greater implementable actuating movement than in the case of extension actuators with a flat arrangement of piezo elements.

Separate holding devices to be mounted on the outside on the prestressing elements and prestressing devices for the piezo elements, as they are known from the prior art, are not necessary for the solution according to the invention. The disadvantages occurring in the known constructions, such as the problematic mounting of the holding device or prestressing device on the intermediate piece, undesirable stress concentrations, stiffness skips, insufficient prestressing forces or the like, can be effectively avoided. Furthermore, the construction of the connection element according to the invention and of the extension actuator is simplified, and the overall weight of the connection element is reduced. Also in comparison to known pure extension actuators, which take over no load-diminishing function, a simplification of the construction can be achieved since, in the solution according to the invention, the load-diminishing intermediate section takes over an advantageous multiple function and thus additional separate prestressing elements, which have to be mounted firmly to the connection element, can be eliminated.

Although the connection element according to the invention is stressed by the prestressing of the piezo stack in addition to the loads already existing as a result of the connection between the at least two structural components, it can absorb this loading without any problem and always securely connect the at least two structural components because the connection element according to the invention is essentially loaded only by longitudinal forces, which permits a simple dimensioning and mechanically favorable conditions while the weight is low. Because of the construction according to the invention, a reliable load transmission is naturally also ensured in the event that the extension actuator fails.

Furthermore, in the case of the connection element according to the invention, the extension actuator has a higher efficiency. This is a result of the improved prestressing of the piezo stack by the load-diminishing connection element itself and of an optimized stiffness ratio of the intermediate section and the piezo stack. For achieving this suitable stiffness ratio, it is not required to provide the connection element with an unfavorable diameter and to thereby weaken it. The parameters and rules required for the optimization will be more precisely described in the following.

Because of the high efficiency, comparatively high forces and large actuating movements can be transmitted to the intermediate section by means of the extension actuator in the operation of the active connection element according to the invention, whereby an improved vibration insulating and minimizing behavior can be implemented.

The connection element according to the invention with its piezo extension actuator is therefore a highly effective and reliable multifunction component which, in addition to having a pure connecting and load-diminishing function, particularly when used in rotorcraft, contributes to a considerable reduction of the vibrations transmitted to an airframe and thus to an improvement of the passenger comfort and to a reduction of vibration-caused loads upon the structure.

Additional preferred and advantageous design characteristics of the connection element include the following.

According to a second aspect, the object of the invention is achieved by a rotorcraft according to the invention, particularly a helicopter, having at least a first structural component (such as a transmission) and at least a second structural component (such as a helicopter airframe) which are connected with one another by at least one active connection element according to the present invention. The rotorcraft according to the invention essentially has the same advantages as those explained above in connection with the connection element according to the invention.

Other objects, advantages and novel features of the present invention will become apparent from the following detailed description of the invention when considered in conjunction with the accompanying drawings.

DETAILED DESCRIPTION

Figure 1:
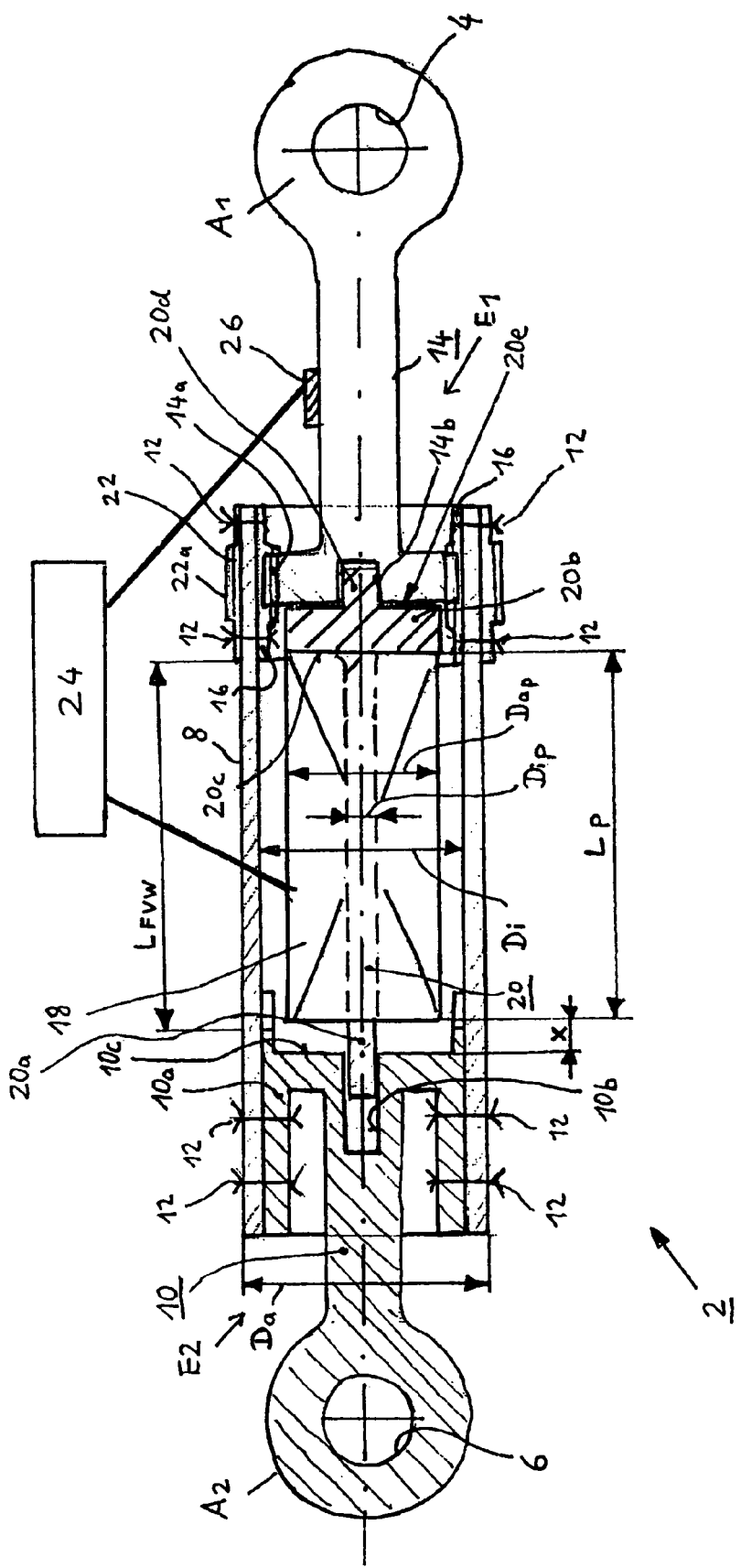
FIG. 1 is a schematic cross-sectional view of a connection element according to an embodiment the invention in a not prestressed condition.

FIG. 1 is a schematic cross-sectional view of a rod-shaped high-stress active connection element according to an embodiment of the invention in a not prestressed condition. This connection element 2, which is used for connecting at least two structural components, will be called an active strut 2 in the following.

The active strut 2 comprises a first end with a first connection area A1 which is assigned to the first structural component (not shown), and a second end with a second connection area A2 which is assigned to the second structural component (not shown). Each connection area A1, A2 is provided with an eye 4, 6 through which a pin (not shown) or the like can be fitted. Between the first and the second connection area A1, A2, a load-diminishing intermediate section Z is arranged through which, when the connection element 2 is stressed, the flux of force extends between the first and second connection area A1, A2. As illustrated in the drawing, the intermediate section Z is constructed as a housing-type, tube-shaped hollow body 8.

The tube-shaped body 8 is completely or essentially completely made of a fiber-reinforced material. In the present example, the hollow body 8 has a closed wall on its circumference. However, in principle, the hollow body 8 may also have one or more openings in its wall. A hollow body 8 is therefore, for example, also a cage-type body whose contour is formed, for example, by grid-shaped, rod-shaped or strip-shaped structures or slots and recesses. Through the openings, the interior of the hollow body 8 as well as components situated therein can be cooled more easily. In addition, by means of the cage-type structure, certain mechanical characteristics of the hollow body 8 can be achieved. The elasticity module of the hollow body 8 constructed of fiber-reinforced material can be defined particularly by the type of the used matrix material, the type of the reinforcing fibers or reinforcing fiber combinations as well as by the fiber orientations.

As illustrated in FIG. 1, the tube-shaped hollow body 8 is closed at one end, that is, in this case, its left end, by means of a hollow-body closing device 10 which, on its left side or on its part projecting out of the hollow body 8, has the second connection area A2. The right side of the hollow-body closing device 8, which forms the actual closure, has a cylindrical stopper 10 provided with a recess 10b or bore, which stopper 10 is inserted into the hollow body 8. The outside diameter of the stopper 10a corresponds essentially to the inside diameter of the hollow body 8 at this point. At the stopper 8a, the hollow-body closing device 10 is glued to the interior circumferential surface of the hollow body 8 and is additionally fixed with form-locking connection devices, such as rivets 12, screws or the like. The glued connections primarily serves a certain stiffness behavior of the connection.

The hollow-body closing device 10 forms an insert (here called second insert E2) which is fastened in an end opening of the hollow body 8 which is on the left in FIG. 1 and is situated opposite a right end opening. Although in this embodiment, the hollow-body closing device 10 is constructed as a separate component made of a metallic material, it can, in principle, also be formed by an integral section of the hollow body 8 itself and in this case have a free end which is provided with the second connection area A2.

FIG. 1 also shows that the active strut 2 according to the invention has an adjustable attachment 14 on the other right end of the hollow body 8, which is situated opposite the hollow-body closing device, which attachment 14 has the first connection area A1. In the present embodiment, this adjustable attachment 14 made of a metallic material is constructed as an adjustable first insert E1 which is fastened in the right end opening of the tube-shaped hollow body 8 situated opposite the hollow-body closing device 10. At its part projecting out of the hollow body 8, the first insert E1 is provided with the first connection area A1.

The adjustability of this first insert E1 with respect to the tube-shaped hollow body 8 is ensured, for example, by a piston-type screwing section 14a provided with an external thread, which screwing section 14a can be screwed into a screwing insert 16 fastened in the right end opening of the tube-shaped hollow body 8 and closes off the right end opening of the hollow body 8. The screwing insert 16 may be an integral component of the hollow body 8 or a separate component connected with the hollow body 8. As a function of the screwing-in or screwing-out depth, the attachment 14 can therefore be adjusted in the longitudinal direction of the active strut 2 or of the hollow body 8 and its axial distance from the hollow-body closing device 10 can be changed.

The mutual spacing of the fastening or riveting points, which in FIG. 1 are in each case on the inside, of the first and second insert E1, E2 on the fiber-reinforced hollow body 8, in the present embodiment, defines a length or a partial length $L_{FVW}$ (length fiber-reinforced material) of the hollow body 8 which enters into the optimization considerations or extension calculations which are the object of the part of the formula indicated farther below.

The active strut 2 according to the invention, which represents a composite strut, furthermore comprises at least one controllable piezo-electric extension actuator which has at least one piezo stack 18 with a length or stacking height $L_P$ measured in the longitudinal direction of the active strut 2. With respect to the flux of force occurring in the strut, the extension actuator is arranged parallel to the intermediate section Z formed by the tube-shaped hollow body 8 and, when the active strut 2 is operated, extends at least the area of the length $L_{FVW}$ of the tube-shaped hollow body 8 in a controlled manner in order to actively suppress or insulate vibrations between the first and the second structural component (not shown). As illustrated in FIG. 1, the extension actuator with its piezo stack 18 is arranged inside the tube-shaped hollow body 8.

Furthermore, the active strut 2 is equipped with a guiding device for the piezo stack 18 which guides the piezo stack 18 when the latter is prestressed and/or in the case of an extension of the piezo-electric extension actuator caused by an actuating movement, and secures it against a tilting. This guiding device has a guiding element 20 movably arranged inside the hollow body 8 and between the hollow body closing device 10 and the adjustable attachment 14, on which guiding element 20 the piezo stack 18 also is mounted. In this embodiment, this guiding element 20 is a plunger-type or piston-type component 20 with a center rod 20a and a piston head 20b. This piston-type component 20 is arranged between the hollow body closing device 10 and the adjustable attachment 14. On its side, which is on the left in FIG. 1, the rod 20a is guided in the recess 10b which is constructed in the center in the cylindrical stopper 10a. On the right side, the piston head 20b has a centering and guiding pin 20d which fits into a corresponding recess 14b provided in the bottom 14c of the screwing section 14a of the attachment 14. The thus designed guiding element 20, together with the piezo stack 18, in the not prestressed condition of the active strut 2, is therefore displaceable by a certain amount x in the longitudinal direction of the active strut 2 or of the tube-shaped hollow body 2.

Finally, the active strut according to the invention also has a prestressing device for the piezo stack 18. The prestressing device is equipped with a prestressing element which can exercise a mechanical pressure-type prestressing onto the piezo stack 18. This prestressing element is the load-diminishing intermediate section Z of the active strut 2 itself, thus, in the present case, the tube-shaped hollow body 8 made of fiber-reinforced material. As a result, the piezo stack 18 in the interior of the hollow body 8 can be prestressed between the hollow body closing device 10 and the adjustable attachment 14 by the hollow body 8, as will be described in greater detail in the following.

As an auxiliary device for generating the prestressing, the tube-shaped hollow body 8 in this embodiment is equipped on at least one end, that is, here that end which is assigned to the adjustable attachment 14, with a fastening section 22 for the temporary fastening of a hollow-body tensioning tool. In this embodiment, this fastening section is constructed as a threaded sleeve 22 with an external thread 22a. The inside diameter of the threaded sleeve 22 corresponds essentially to the outside diameter of the tube-shaped hollow body 8. Like the screwing insert 16, the threaded sleeve 22 is also glued to the tube-shaped hollow body 8 and additionally is fixed by means of form-locking connecting devices, such as rivets 12, screws or the like. Joint connection devices 12 can be used for the threaded sleeve 22 and the screwing insert 16, as outlined in FIG. 1.

Since, as mentioned above, the tube-shaped hollow body 8 is made of a fiber-reinforced material, a favorable stiffness behavior, an improved prestressing and an increased efficiency of the piezo stack 18 as well as an active strut 2 which is optimized as a whole can be implemented, as will be described in greater detail in the following. When the fiber-reinforced material is appropriately selected, the piezo stack can furthermore be electrically insulated in an effective manner with respect to significant areas or components of the active strut 2, which further simplifies and facilitates the overall construction. However, the invention is not limited to such an insulating fiber-reinforced material. Depending on the application case, the fiber-reinforced material can also contain electrically conductive elements, such as carbon fibers.

The active strut 2 according to the invention or its piezo extension actuator can be controlled by a control and/or regulating device 24 known per se, which comprises at least one vibration sensor 26 which, in this example, is arranged in the proximity of the connection area A1 of the adjustable attachment 14.

The prestressing of the active strut 2 according to the invention and of its piezo stack 18 will now be described. In a supplementary manner, reference is made to FIG. 2, which is a schematic cross-sectional view of the active strut 2 of FIG. 1 according to the invention in a prestressed condition.

For the prestressing, starting from the condition illustrated in FIG. 1, first the adjustable attachment 14 is screwed so far into the screwing insert 16 and the tube-shaped hollow body 8 that the piezo stack 18 guided on the guiding element 20 comes to rest with its left side on the bottom surface 10c of the stopper 10a and with its right side on the left face 20c of the piston head 20b. As a result of this screwing-in, the rod 20a has simultaneously moved farther to the left into the recess 10b, and the bottom surface 20e of the piston head 20b rests flush and essentially without play against the bottom 14c of the screwing section 14a. Then an external tensioning device (for example, a hydraulic or mechanical device; not shown) is fastened to the active strut 2 by way of the threaded sleeve 22 and, for example, the connection area A2 of the hollow body closing device 10.

By activating this external tensioning device, the tube-shaped hollow body 8 is then elastically extended by a predefined amount and prestressed. As a result, the adjustable attachment 14 again receives play with respect to the piston head 20b and can be screwed farther into the hollow body 8 until it again rests flush and without play against the face 20c of the piston head 20b. This process can be repeated one or more times, as required. The force exercised upon the tube-shaped hollow body by the external tensioning device can be determined and checked by way of a suitable measuring device which, for example, has a strain gauge or the like mounted on the exterior side of the hollow body 8. The required prestressing is to be selected such that, during the operation of the active strut 2 and the resulting loads, the piezo stack 18 is not completely relieved from its pressure-type prestressing.

Subsequently, the action of the force generated by the external tensioning device is canceled and the tensioning device is removed. As a result of its restoring endeavor, the elastically prestressed tube-shaped hollow body 8 can now, in turn, exercise a prestressing, that is, here, a compressive stress, onto the piezo stack 18. Since the guiding element 20 with its piston head 20b is supported on the adjustable attachment 14, and the piezo stack 18 is arranged between the piston head 20b and the hollow body closing device 10, the piezo stack 18 is therefore prestressed between the guiding element 20, the attachment 14 and the hollow body closing device 10 by the tube-shaped hollow body 8. In this case, the extension actuator or its piezo stack 18 is arranged parallel to the intermediate section Z formed by the tube-shaped hollow body 8 or—relative to the occurring forces or the flux of force—connected in parallel. By controlling the piezo elements 18 of the extension actuator by means of electrical signals, these and thus, in turn, the entire strut 2 can be actively extended in order to thereby actively suppress or insulate vibrations between the first and second structural component to be connected.

However, in principle, the active strut 2 according to the invention and the piezo stack 18 can be prestressed also without applying an external load generated by means of a separate hollow-body tensioning tool. For this purpose, the adjustable attachment 14 is screwed so far into the tube-shaped hollow body 8 that a sufficient tensile stress is generated in the hollow body 8 or in the intermediate section Z and a sufficient compressive stress is generated in the piezo stack 18. The amount of prestressing achieved in this manner can be determined, for example, again by means of a strain gauge which is preferably mounted on the exterior side of the hollow body 8.

The active strut 2 according to the invention can be designed and optimized according to the following formulas. The following symbols are used here:

- $F_{FVW}$: Cross-sectional surface of the hollow body made of fiber-reinforced material
- $A_P$: Cross-sectional surface of the piezo element stack 18
- $\epsilon_{FVW}$: Extension in the hollow body 8 made of fiber-reinforced material
- $\epsilon_{Piezo}$: Extension in the piezo stack 18
- $\epsilon_e$: Elastic pressure (prestressing) in the piezo stack 18
- $\epsilon_v$: Elastic pre-extension of the hollow body 8 made of fiber-reinforced material before the connecting
- $\epsilon_P$: Active extension of the piezo stack 18 alone
- $\epsilon_a$: Active extension of the active strut 2
- $EA_{FVW}$: Extension stiffness of the hollow body 8 made of fiber-reinforced material
- $EA_{Piezo}$: Extension stiffness of the piezo stack 18
- $E_{FVW}$: Modulus of elasticity of the hollow body 8 made of fiber-reinforced material
- $E_P$: Modulus of elasticity of the piezo stack 18
- FVW: Abbreviation for fiber-reinforced material
- $F_{FVW}$: Prestressing load on the hollow body 8 made of fiber-reinforced material
- $F_{FVW\_after}$: Force in the hollow body 8 made of fiber-reinforced material after the connecting
- $F_{Piezo\_after}$: Force in the piezo stack 18 after the connecting
- $L_{FVW}$: Partial tube length of the hollow body 8 made of fiber-reinforced material in the area of the piezo stack 18, measured between two fixing points
- $L_P$: Length or stack height of the piezo stack 18
- S: Stiffness ratio of $EA_{FVW}$ to $EA_{Piezo}$
- V: Prestressing ratio $V = \epsilon_v/\epsilon_e$ $$\eta_\epsilon = \frac{\epsilon_a}{\epsilon_p}:$$

Efficiency of the active extension of the composite structure of the active strut 2

The following formulas apply in the event that $$L_{FVW} = L_P.$$

$L_{FVW}$ and $L_P$ cannot be found in the following formula because they cancel each other out. However, it should be explicitly pointed out that the invention is not limited to the case $L_{FVW} = L_P$. The length $L_P$ of the piezo stack and the length $L_{FVW}$ of the fiber-reinforced tube may also differ from one another, which would have to be taken into account correspondingly in the formulas. This then results in another parameter for designing and adapting the spring rigidity of these components for optimization purposes.

I. Elastic (Pressure-Type) Prestressing of the Piezo Actuator:

a) Prestressing of the hollow body 8 made of fiber-reinforced material (no additional loads are applied to the active strut 2 and the hollow body 8):

$$\epsilon_v = \frac{F_{FVW}}{EA_{FVW}} \tag{1}$$

The following applies in this condition to the extensions in the hollow body 8 made of fiber-reinforced material and=in the piezo element stack 18:

$$\epsilon^*_{FVW} = \epsilon_v$$

$$\epsilon^*_P = 0$$

b) After the connecting of the prestressed hollow body 8 made of fiber-reinforced material to the adjustable attachment 14, the complete screwing of the attachment 14 into the hollow body 8 and the removal of the external tensioning device (abbreviated to "after the connecting"), the following applies to the active strut 2:

$$\begin{cases} \epsilon_{FVW} = \epsilon_v - \epsilon_e \\ \epsilon_{Piezo} = -\epsilon_e \end{cases} \tag{2}$$

$$\epsilon_{FVW} - \epsilon_{Piezo} = \epsilon_v$$

$$\epsilon_{FVW} = \frac{F_{FVW\_nach}}{EA_{FVW}} \tag{3}$$

$$\epsilon_{piezo} = -\frac{F_{Piezo\_nach}}{EA_{piezo}} \tag{4}$$

$$F = F_{Piezo\_nach} = F_{FVW\_nach} \tag{5}$$

The following is obtained from (1), (2), (3), (4), (5):

$$\frac{F}{EA_{FVW}} + \frac{F}{EA_{piezo}} = \frac{F_{FVW}}{EA_{FVW}} \tag{6}$$

$$\frac{F}{EA_{piezo}}\left(\frac{EA_{piezo}}{EA_{FVW}} + 1\right) = \frac{F_{FVW}}{EA_{FVW}}$$

$$-\epsilon_e = -\epsilon_{piezo} = \frac{\epsilon_v}{\frac{EA_{piezo}}{EA_{FVW}} + 1}$$

II. Active Extension of the Composite Structure of the Active Strut

Analogous to Equation (6), the extension $\epsilon_a$ of the composite structure of the active strut 2 is obtained from the active extension $\epsilon_P$ of the piezo stack 18 as follows:

$$\epsilon_a = \frac{\epsilon_p}{\frac{EA_{FVW}}{EA_{piezo}} + 1} \tag{7}$$

III. Design

Thereby the active strut 2 can be designed.

The following applies to the efficiency of the active extension of the composite structure of the active strut 2:

$$\eta_\epsilon = \frac{\epsilon_a}{\epsilon_p} = \frac{1}{\frac{EA_{FVW}}{EA_{Piezo}} + 1} = \frac{1}{S+1} \tag{8}$$

The required prestressing ratio V is obtained by means of the stiffness ratio S:

$$\frac{\varepsilon_v}{\varepsilon_e} = V = \frac{EA_{Piezo}}{EA_{FVW}} + 1 = \frac{1}{S} + 1 = 1 + \frac{\eta_e}{1-\eta_e} \quad (9)$$

Thus, the relationships between $\eta_e$, S and V are known, which represent the essential design and optimization parameters in this embodiment.

EXAMPLE OF DESIGN

Figure 2:
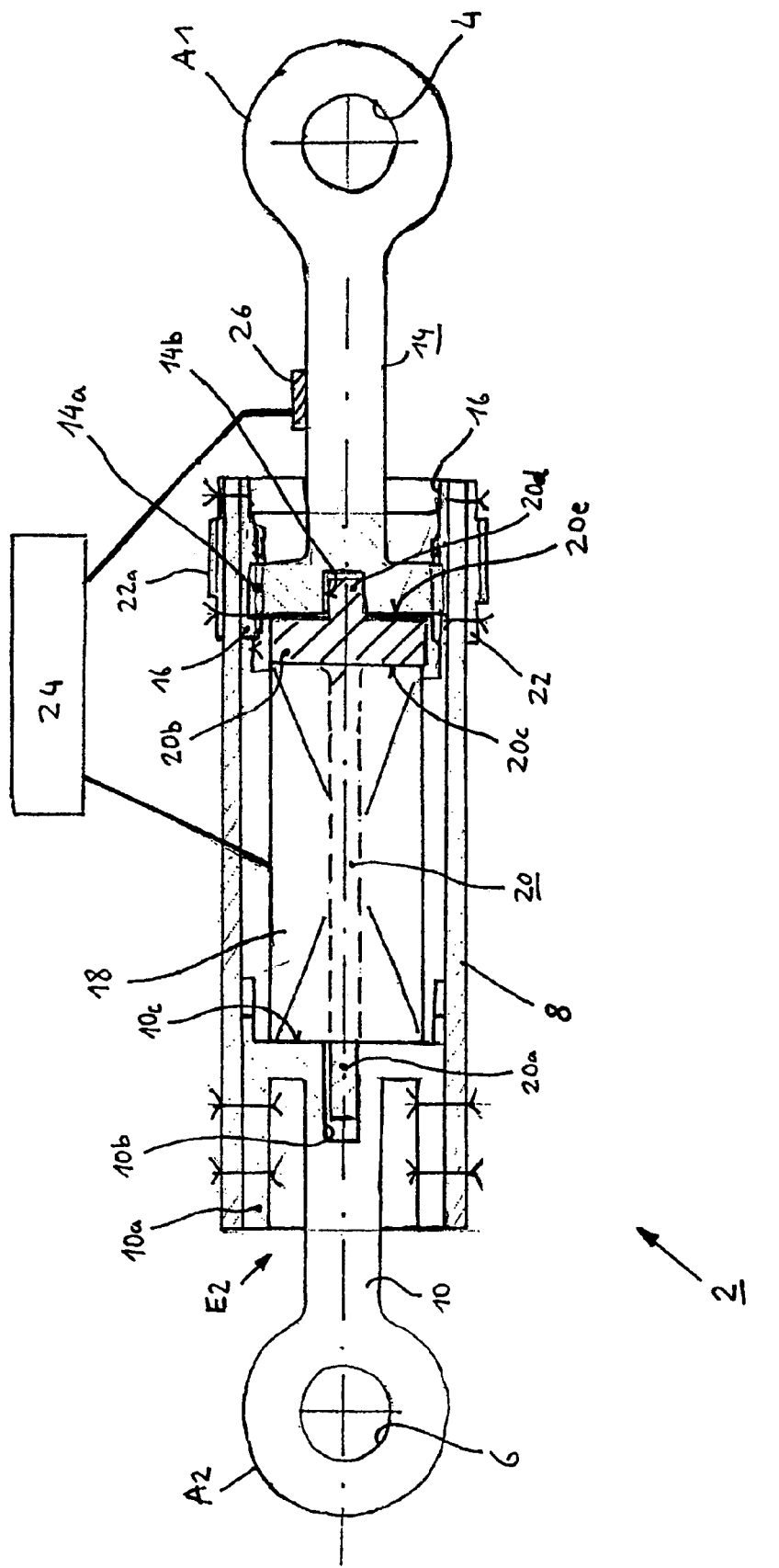
FIG. 2 is a schematic cross-sectional view of the connection element of FIG. 1 in a prestressed condition.

Taking into account the above-mentioned formulas, optimization rules and comments, the active strut 2 according to the invention illustrated in FIGS. 1 and 2 may, for example, have the following essential dimensions and parameters:

For the Hollow Body 8 Consisting of Composite Fiber Tube:

| | |
|---|---|
| Outside Diameter: | $D_a$ = 30 mm |
| Inside Diameter: | $D_i$ = 26 mm |
| Modulus of Elasticity: | $E_{FVW}$ = 60,000 N/mm² |
| Strain Rigidity: | $EA_{FVW}$ = 1.06 · 10⁷ N |
| Cross-Sectional Area: | $A_{FVW}$ = 176 mm² |
| Partial Tube Length between Two Mounting Points in the Area of the Piezo Stack | $L_{FVW}$ = 100 mm |

For the Piezo Element Stack 18 of The Extension Actuator:

| | |
|---|---|
| Outside Diameter: | $D_{aP}$ = 15 mm |
| Inside Diameter: | $D_{iP}$ = 10 mm |
| Modulus of Elasticity: | $E_P$ = 55,000 N/mm² |
| Strain Rigidity: | $EA_{Piezo}$ = 5.40 · 10⁷ N |
| Cross-Sectional Area: | $A_P$ = 98 mm² |
| Height of the Piezo Stack: | $L_P$ = 100 mm |

For a desired efficiency $\eta_e$ of the active extension of approximately 0.7, taking into account the above-indicated formulas, in the case of a given stiffness ratio S of 1.95, a prestressing ratio V of 1.5 is therefore required. In the case of the active strut according to the invention, the efficiency may be in a range of from approximately 0.5 to approximately 0.9.

The connection element according to the invention or the active strut according to the invention can particularly advantageously be used in the case of a rotorcraft, particularly a helicopter. In this case, the helicopter comprises, for example, a first structural component, such as a helicopter airframe, and at least a second structural component, such as a transmission, which are mutually connected by at least one such connection element. For example, seven connection elements according to the invention may be provided between the transmission and the airframe, of which, in the Cartesian system of coordinates (X, Y, Z) four (so-called Z-struts) diminish (absorb? translator) the weight of the helicopter airframe and torques about the X- and Y-axis; two (so-called X-struts) diminish the longitudinal forces and the torques about the Z-axis; and one (so-called Y-strut) diminishes the transverse load.

The invention is not limited to the above embodiment which is used only for a general explanation of the core idea of the invention. Within the scope of protection, the active connection element or the active strut 2 according to the invention can also have other embodiments than concretely described above. Depending on the usage, the hollow body 8 may also have different diameters and wall thicknesses along its length. Furthermore, different fiber-reinforced materials and also other materials, such as aluminum, as well as combinations thereof can be used for the hollow body 8. In addition, the hollow body closing device 10 and the adjustable attachment 14 or the inserts E1 and E2 may have passage openings. A variant of the connection element according to the invention can also be implemented in the case of which, instead of the hollow body closing device 10, a second adjustable attachment 14 is provided, and the piezo element stack 18 is then arranged between two attachments and is prestressed. In the case of such a variant, the embodiment of the guiding element 20 can essentially be analogous to the above-described embodiment. Instead of an interior guiding element, which extends through the piezo element stack 18, an external guiding element can also be implemented.

Reference numbers in the claims, the description and the drawings are used only for a better explanation of the invention and should not limit the scope of protection.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

| List of Reference Symbols | |
|---|---|
| 2 | Active strut/active connection element |
| 4 | eye |
| 6 | eye |
| 8 | hollow body made of fiber-reinforced material, tube-shaped |
| 10 | hollow body closing device |
| 10a | cylindrical stopper of 10 |
| 10b | recess in 10a |
| 10c | bottom surface of 10a |
| 12 | rivets/connection devices |
| 14 | adjustable attachment |
| 14a | screwing section of 14 |
| 14b | recess in 14a |
| 16 | screwing insert |
| 18 | piezo stack |
| 20 | guiding element/piston-type component |
| 20a | rod of 20 |
| 20b | piston head of 20 |
| 20c | face of 20b |
| 20d | centering pin of 20b |
| 20e | bottom surface of 20 |
| 22 | fastening section for hollow body tensioning tool/threaded sleeve |
| 22a | external thread of 22 |
| 24 | control and/or regulating device |
| 26 | vibration sensor |
| A1 | first connection area of 2 |
| A2 | second connection area of 2 |
| E1 | first insert |
| E2 | second insert |
| x | displacement path |

The invention claimed is:

1. Rod-shaped high-stress active connection element for connecting at least two structural components, comprising
a first end with a first connection area, which is assigned to a first of the two structural components, and a second end with a second connection area, which is assigned to a second of the two structural components, a load-diminishing intermediate section arranged between the first and second connection areas, through which intermediate section the flux of force between the first and second connection areas extends when the connection element is loaded, at least one controllable extension actuator which has at least a piezo stack and is arranged parallel to the intermediate section and, when operated, extends the connection element at least in the flux of force-bearing area of the intermediate section in a controlled manner in order to actively suppress or insulate vibrations between the first and second structural component, and a prestressing device having a prestressing element for use in applying a mechanical compressive prestress onto the piezo stack, wherein the prestressing element is the load-diminishing intermediate section itself.

2. Connection element according to claim 1, wherein the load-diminishing intermediate section is made of a fiber-reinforced material.

3. Connection element according to claim 1, wherein the load-diminishing intermediate section is constructed as a rod-shaped body which extends through the extension actuator.

4. Connection element according to claim 1, wherein the load-diminishing intermediate section is constructed as a housing-type hollow body and the extension actuator is arranged inside this hollow body.

5. Connection element according to claim 4, wherein the hollow body is constructed as a cage-type body whose contour is formed by grid-shaped, rod-shaped or strip-shaped structures or slots and recesses.

6. Connection element according to claim 4, wherein the hollow body is closed at one end by a hollow body closing device which has the second connection area, at an opposite end of the hollow body, which is situated opposite the hollow body closing device, an attachment is fastened which can be adjusted with respect to the hollow body closing device and has the first connection area, and the piezo stack is disposed in the interior of the hollow body between the hollow body closing device and the adjustable attachment, and the adjustable attachment is adjustable to cooperate with the hollow body to apply a prestress to the piezo stack.

7. Connection element according to claim 4, wherein at each end of the hollow body, one adjustable attachment is fastened, with one adjustable attachment having the first connection area, and the other adjustable attachment having the second connection area, and the piezo stack is disposed in the interior of the hollow body between the adjustable attachments, and the adjustable attachments are adjustable to cooperate with the hollow body to apply a prestress to the piezo stack.

8. Connection element according to claim 6, wherein the adjustable attachment is constructed as an adjustable first insert which is fastened in a first opening of the hollow body situated opposite the hollow body closing device, and, on its part projecting out of the hollow body, is provided with the first connection area.

9. Connection element according to claim 6, wherein the hollow body closing device is a second insert, which is fastened in a second end-opening of the hollow body situated opposite the first end opening, and, on its part projecting out of the hollow body is provided with the second connection area.

10. Connection element according to claim 6, wherein the hollow body closing device is formed by an integral section of the hollow body itself and has a free end which is provided with the second connection area.

11. Connection element according to claim 6, wherein the connection element has a guiding device for the piezo stack, which guiding device guides the piezo stack under one of the prestress and an extension of the extension actuator caused by an actuating movement and secures the piezo stack against tilting.

12. Connection element according to claim 11, wherein the guiding device has a guiding element which is movably arranged within the hollow body and between the hollow body closing device and the adjustable attachment and on which guiding element the piezo stack is mounted.

13. Connection element according to claim 12, wherein, in the prestressed condition of the piezo stack, the guiding element is supported with at least one side on one of the adjustable attachment and the hollow body closing device, and the piezo stack is prestressed by the hollow body between the guiding element, the adjustable attachment and the hollow body closing device.

14. Connection element according to claim 1, wherein, on at least one end, the intermediate section has a fastening section for the temporary fastening of an intermediate section tensioning tool.

15. Connection element according claim 1, wherein the length of the piezo stack and the length of the intermediate section measured between two mutually opposite mounting points are different.

16. Rotorcraft, particularly a helicopter, comprising at least a first and at least a second structural component which are mutually connected by at least one active connection element according to claim 1.

\* \* \* \* \*